(12) United States Patent
Zorn et al.

(10) Patent No.: US 11,107,548 B2
(45) Date of Patent: *Aug. 31, 2021

(54) LEVERAGING CHIP VARIABILITY

(71) Applicant: MICROSOFT TECHNOLOGY LICENSING, LLC, Redmond, WA (US)

(72) Inventors: Benjamin Zorn, Woodinville, WA (US); Ray Bittner, Sammamish, WA (US); Darko Kirovski, Kirkland, WA (US); Karthik Pattabiraman, Vancouver (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/926,183

(22) Filed: Jul. 10, 2020

(65) Prior Publication Data

US 2020/0342950 A1    Oct. 29, 2020

Related U.S. Application Data

(60) Continuation of application No. 15/956,061, filed on Apr. 18, 2018, now Pat. No. 10,748,640, which is a continuation of application No. 15/462,730, filed on Mar. 17, 2017, now Pat. No. 9,978,461, which is a continuation of application No. 14/604,608, filed on (Continued)

(51) Int. Cl.
| | | |
|---|---|---|
| *G11C 29/44* | (2006.01) | |
| *G11C 29/38* | (2006.01) | |
| *G11C 29/56* | (2006.01) | |
| *G06F 11/10* | (2006.01) | |
| *G06F 11/14* | (2006.01) | |

(52) U.S. Cl.
CPC .......... *G11C 29/44* (2013.01); *G06F 11/1048* (2013.01); *G06F 11/14* (2013.01); *G11C 29/38* (2013.01); *G11C 29/56008* (2013.01)

(58) Field of Classification Search
CPC ... G11C 29/44; G11C 29/38; G11C 29/56008; G06F 11/14; G06F 11/1048
See application file for complete search history.

(56) References Cited

U.S. PATENT DOCUMENTS

| | | | |
|---|---|---|---|
| 8,412,882 B2 * | 4/2013 | Zorn | G11C 29/56008 711/105 |
| 8,977,910 B2 * | 3/2015 | Zorn | G06F 11/14 714/48 |

(Continued)

*Primary Examiner* — Tri M Hoang
(74) *Attorney, Agent, or Firm* — Ray Quinney & Nebeker; Adam K. Richards; Hannah Zhang (57) ABSTRACT

Embodiments are described that leverage variability of a chip. Different areas of a chip vary in terms of reliability under a same operating condition. The variability may be captured by measuring errors over different areas of the chip. A physical factor that affects or controls the likelihood of an error on the chip can be varied. For example, the voltage supplied to a chip may be provided at different levels. At each level of the physical factor, the chip is tested for errors within the regions. Some indication of the error statistics for the regions is stored and then used to adjust power used by the chip, to adjust reliability behavior of the chip, to allow applications to control how the chip is used, to compute a signature uniquely identifying the chip, etc.

20 Claims, 9 Drawing Sheets

Related U.S. Application Data

Jan. 23, 2015, now Pat. No. 9,666,303, which is a continuation of application No. 13/791,479, filed on Mar. 8, 2013, now Pat. No. 8,977,910, which is a division of application No. 12/819,100, filed on Jun. 18, 2010, now Pat. No. 8,412,882.

(56) References Cited

U.S. PATENT DOCUMENTS

| | | | |
|---|---|---|---|
| 9,666,303 B2 * | 5/2017 | Zorn | G06F 11/1048 |
| 9,978,461 B2 * | 5/2018 | Zorn | G06F 11/1048 |
| 10,748,640 B2 * | 8/2020 | Zorn | G06F 11/1048 |
| 2005/0281112 A1 * | 12/2005 | Ito | G11C 11/406 |
| | | | 365/222 |
| 2010/0106901 A1 * | 4/2010 | Higeta | G11C 29/52 |
| | | | 711/106 |
| 2010/0165692 A1 * | 7/2010 | Jeddeloh | G11C 11/4097 |
| | | | 365/51 |
| 2010/0180150 A1 * | 7/2010 | Jeddeloh | G06F 11/0766 |
| | | | 714/5.1 |
| 2010/0192041 A1 * | 7/2010 | Jeddeloh | H01L 27/10897 |
| | | | 714/763 |

* cited by examiner

LEVERAGING CHIP VARIABILITY

RELATED APPLICATIONS

This application is a continuation of prior application Ser. No. 15/956,061, filed Apr. 18, 2018, now issued as U.S. Pat. No. 10,748,640, which is a continuation of patented prior application Ser. No. 15/462,730, filed Mar. 17, 2017, now issued as U.S. Pat. No. 9,978,461, which is a continuation of patented prior application Ser. No. 14/604,608, filed Jan. 23, 2015, now issued as U.S. Pat. No. 9,666,303, which is a continuation of patented prior application Ser. No. 13/791,479, filed Mar. 8, 2013, now issued as U.S. Pat. No. 8,977,910, which is a divisional of patented prior application Ser. No. 12/819,100, filed Jun. 18, 2010, now issued as U.S. Pat. No. 8,412,882. The aforementioned applications are incorporated herein by reference in their originally filed forms.

BACKGROUND

Figure 1:
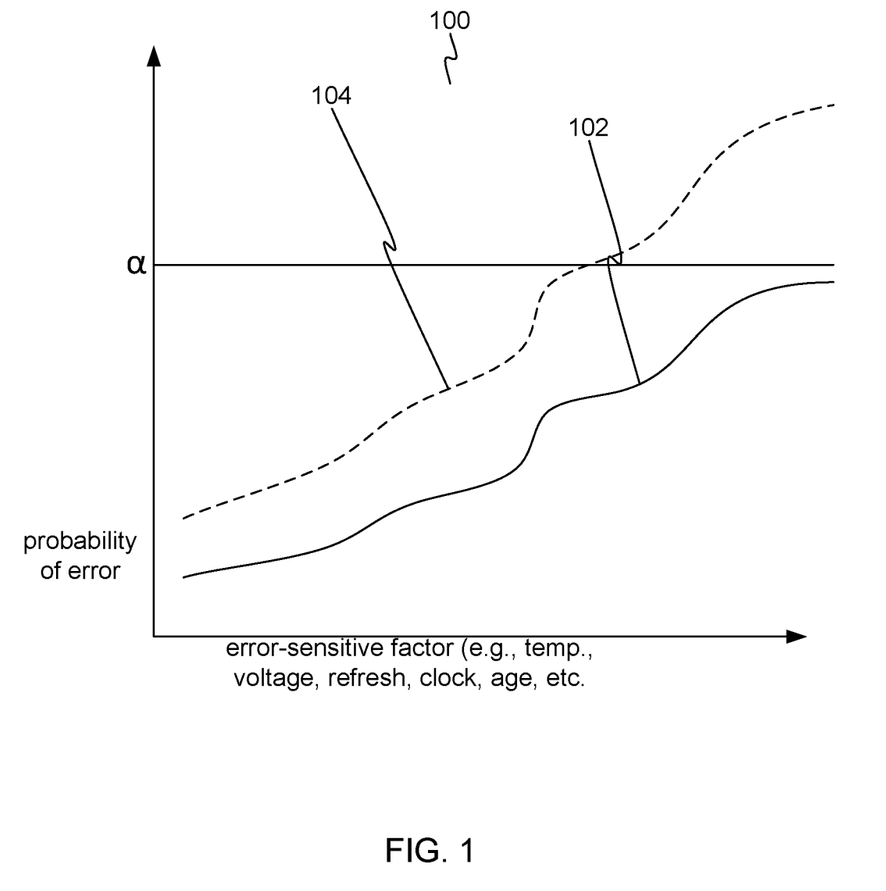
FIG. 1 shows a graph.

Chips, and in particular memory chips, are manufactured and provided to purchasers with a guarantee that a chip will most likely operate without errors if operated within parameters specified by the manufacturer. That is to say, a chip may be designed to provide error-free data storage if the chip is within a certain age, temperature, voltage, clock frequency, refresh rate, or other similar error-sensitive operation factor. DRAM chips in particular are overdesigned so that every cell among the billions on a chip loses data only with a very low probability under normal operating conditions. However, almost all of the memory cells in a typical DRAM chip can hold their value even if the operating conditions are changed. If a DRAM chip is refreshed at a below-recommended rate, almost all of the cells in the chip will continue to accurately retain their assigned values. As a result, typical DRAM chips are consuming power in the form of refresh power that is unnecessary for their effective operation. FIG. 1 illustrates this concept.

FIG. 1 shows a graph 100. The graph 100 reflects expected error behavior for a chip over a range of values for an error-sensitive factor (ESF). Suppose, for example, that the ESF is temperature. Suppose also that when operated at a manufacturer's recommended power-related settings (e.g., voltage, refresh rate, etc.) the chip has a probability of error-free operation that varies as a function of the temperature, as represented by solid line 102. Note that at some ESF values the probability of error may be well below what is needed or practical use (e.g., failure might occur once in a hundred years of continuous operation). Suppose that a desired maximum probability of error is a. Note that at the manufacturer's specified power level, the probability of error will always be below $\alpha$. However, if the chip is operated with less power, even though the probability of error generally increases, as shown by line 104, below some ESF values, the probability of error will be below $\alpha$.

Not only are chips often over-provisioned with respect to current or actual conditions or ESF values, they may be over-provisioned for certain portions of a chip. Chip manufacturing is an intricate process with considerable intra-process variation. There are variations from chip to chip. Chip manufacturers set a threshold for rejecting chips that do not conform to a specified quality threshold (measured in terms of performance, errors-per-chip, etc.). However, such thresholds are usually set low to ensure adequate yields, especially for commodity chips like DRAM chips. As a result, there is considerable variation even among chips that pass quality control. Some chips may have areas or regions that are more error-tolerant than other regions and therefore may require less power.

Embodiments described herein relate to leveraging variations in chips for both power optimization and unique identification.

SUMMARY

The following summary is included only to introduce some concepts discussed in the Detailed Description below. This summary is not comprehensive and is not intended to delineate the scope of the claimed subject matter, which is set forth by the claims presented at the end.

Embodiments are described that leverage variability of a chip. Different areas of a chip vary in terms of reliability under a same operating condition. The variability may be captured by measuring errors over different areas of the chip. A physical factor that affects or controls the likelihood of an error on the chip can be varied. For example, the voltage supplied to a chip may be provided at different levels. At each level of the physical factor, the chip is tested for errors within the regions. Some indications of the error statistics for the regions are stored and then used to adjust power used by the chip, to adjust reliability behavior of the chip, to allow applications to control how the chip is used, to compute a signature uniquely identifying the chip, etc.

Many of the attendant features will be explained below with reference to the following detailed description considered in connection with the accompanying drawings.

BRIEF DESCRIPTION OF THE DRAWINGS

The present description will be better understood from the following detailed description read in light of the accompanying drawings, wherein like reference numerals are used to designate like parts in the accompanying description.

DETAILED DESCRIPTION

Figure 2:
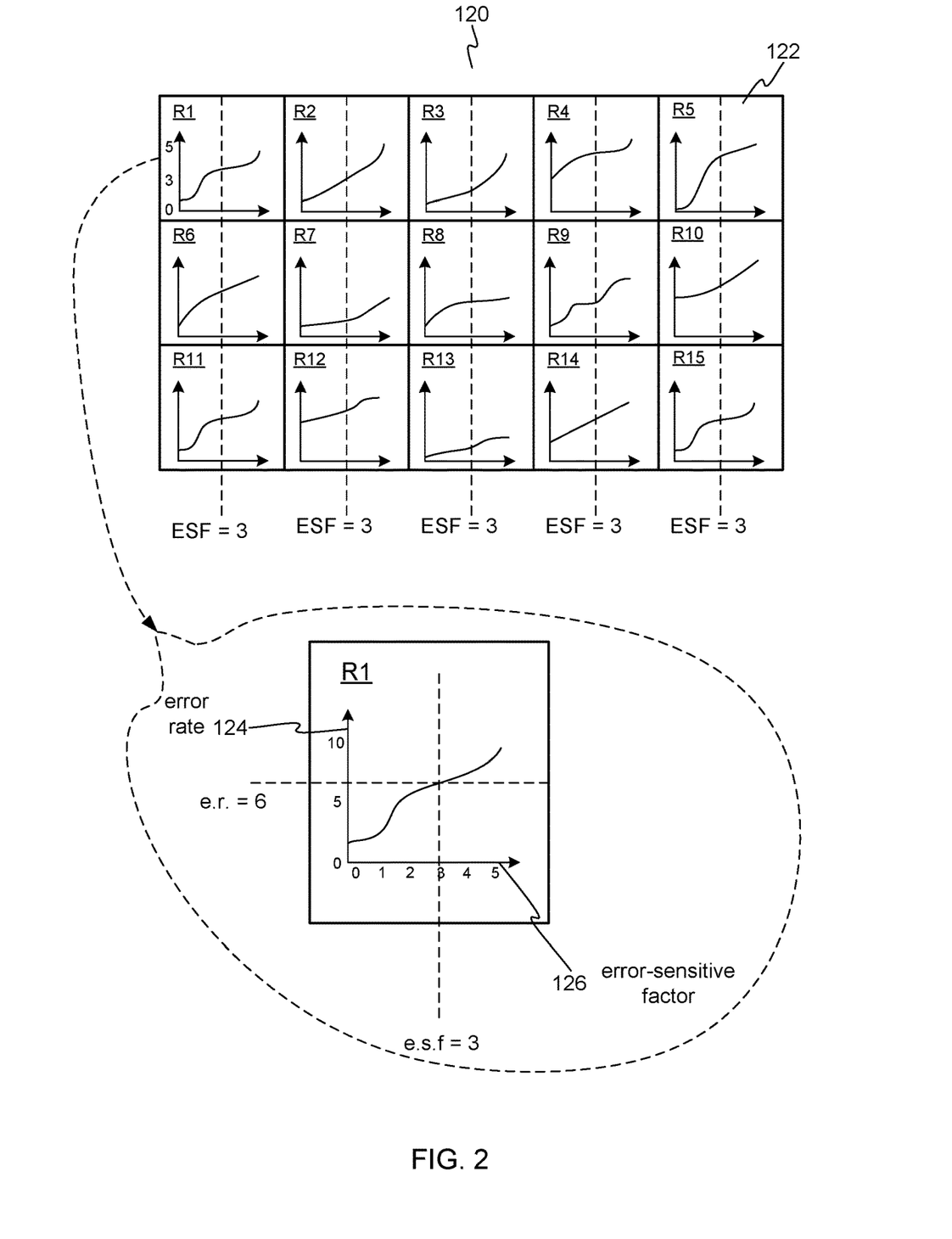
FIG. 2 shows example regional variations of a chip.

FIG. 2 shows example regional variations of a chip 120. Because the quality of production within a chip 120 may vary significantly, areas or regions 122 of a chip may vary in their ability to accurately store data under varying conditions. Such conditions will be referred to as error-sensitive physical traits, environmental parameters, operational parameters, or, for ease of discussion, error-sensitive factors (ESFs). An ESF may be thought of as any physical aspect of a chip that directly affects the probability that the cells of a chip will incorrectly store data. In other words, when an ESF changes (e.g., voltage drops, temperature rises) the reliability of the chip also changes. When an ESF changes for a chip, there is a change in the probability that a bit value stored in any cell of the chip will be the same as a bit value read from that cell. In short, changes in one or more ESFs affect the probability that a cell's value will erroneously flip. Note that the source of an error may in general also exist in the logic or wiring that connects memory cells, as these are also affected by ESFs. These errors may arise in the form of propagation delay or non-linear circuit effects.

As noted, regions 122 of a chip may have varying reliability. Some regions 122 may have higher or lower probabilities of errors than other regions 122 under a same set of ESFs. Although an ESF may be measured in a way that suggests an ESF is the same over all regions 122, in reality, at any given time, an ESF's measureable value at different regions 122 may actually vary. A chip may have hot spots, areas where voltage is slightly higher or lower, and so on. Nonetheless, for purposes herein, an ESF may be treated as a uniform property. For instance, if a chip is measured as having a given input voltage, the voltage will vary within that chip in a consistent way. When a chip is sensed as having a single apparent chip-wide temperature at different times, if other ESFs are substantially unchanged, any region will have nearly the same temperature at those times, even if the temperature of the region differs from the measured or sensed temperature. Thus, it may be seen that if a chip's error behavior is to be modeled in terms of ESFs, a single same measure of an ESF will be sufficient to model the error behaviors of the regions of the chips.

Referring again to the example of FIG. 2, the ESF will be assumed to be temperature, and the value at a given time will be assumed to be 3 temperature units. A graph in each region 122 of error-rate 124 as a function of temperature 126 illustrates how regions differ 122 under a same ESF. At ESF of temperature=3, the error rate for region R1 is 6 (e.g., 6 errors per 1 trillion reads). At region R13, under the same ESF value, the error rate is 3. Not only is there regional variation, but that variation can change as the ESF value changes (usually monotonically). As will be explained, this regional variation in error likelihood can be measured, modeled, and used to advantage.

Figure 3:
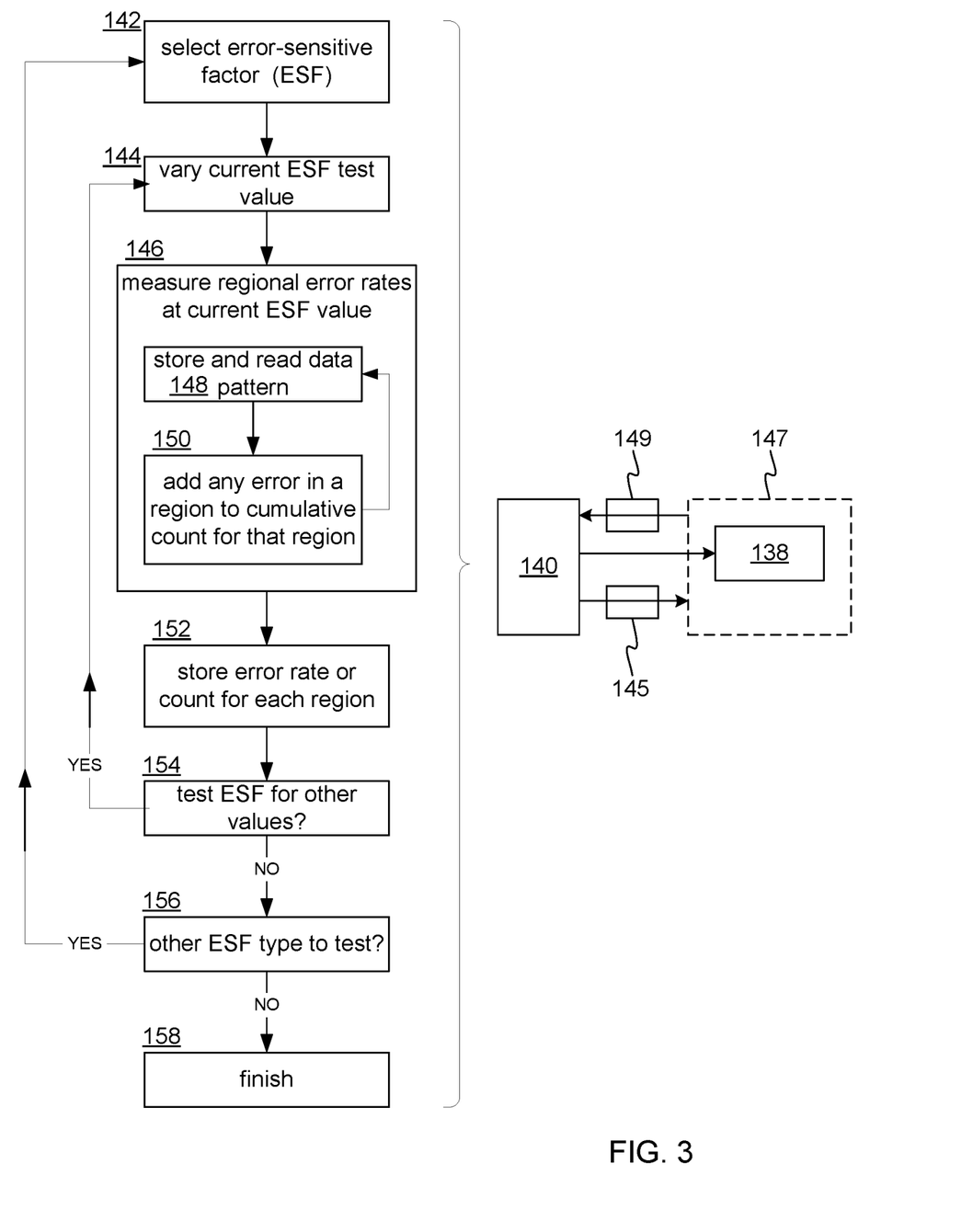
FIG. 3 shows a system for building a statistical model of regional error characteristics of a chip.

FIG. 3 shows a system for building a statistical model of regional error characteristics of a chip 138. If there are multiple ESFs to test, a computer 140 begins by selecting 142 an ESF. For example, voltage may be selected 142. The current value of the selected 142 ESF is measured, set, or varied 144. For instance, the voltage may be set to 1.7 V using an appropriate device 145 such as test board, motherboard, etc. In the case of temperature, temperature may be induced by a heater 147. Measurement may performed by a sensor 149 (which may be on the chip 138 or near it). In the case of voltage, a line reading may be taken. In the case of clock speed, the clock speed may be measured or obtained from a stored setting.

Given the ESF value, the process then involves measuring 146 error behaviors for various regions of chip 138 at the ESF value. The error measuring 146 can be performed in numerous ways. A data pattern such as all-1s, all-0s, random bits, interleaved strings of 0s and 1s, etc., is stored to and read from 148 the chip 138. When the data is read, the read values are compared against the original data. Each region being tested has an error counter. When an error is encountered (e.g., a word, bit, etc. does not match its original value), the error counter for the corresponding region is incremented 150. The storing, reading, and counting are repeated and the number of loops (reads and writes) is stored 152 along with the error information or error count of each tested region. Note that for each store and read 148 iteration and/or for each varied value of the ESF, the data pattern may be varied, for example, the data pattern may be randomly selected from a dictionary of patterns, or alternated between all-zeros and all-ones, etc. In addition to the write-read-compare technique, in cases where errors are more likely to be related to logic delays and clock rate, bit scan chains and test patterns can be used to generate and seek errors.

In one embodiment, the ESF is tested for different values of the current ESF; if there are other 154 values to test, the ESF value is varied 144 (e.g., voltage is lowered from 1.7 V to 1.6 V), and the measuring 146 and storing 152 are repeated for that value. In one embodiment, it may be sufficient to test for only one value of the ESF. For example, the behavior of a chip family or material or the general affect of the ESF may allow error behavior of a region to be extrapolated to other values of the ESF.

If 154 the ESF is to be tested for multiple values, the varying 144, measuring 146, and storing 152 are repeated as needed. When errors have been measured and stored 152 for the value(s) of an ESF, if 156 there is another ESF to test, then another ESF is selected 142, and the varying 144 and measuring 146 are repeated. Otherwise, the process is finished 158.

From the numerous store, read, and compare cycles, the error behavior of a region can be derived from the number of cycles and the number of cumulative detected errors. For example, at a given ESF value, one region might have 1 error in 1,000,000 cycles, and another region might have 5 errors in those same 1,000,000 cycles. Errors might also be characterized in terms of clock cycles, overall test time, errors per amount of data read/written, and so on.

Figure 4:
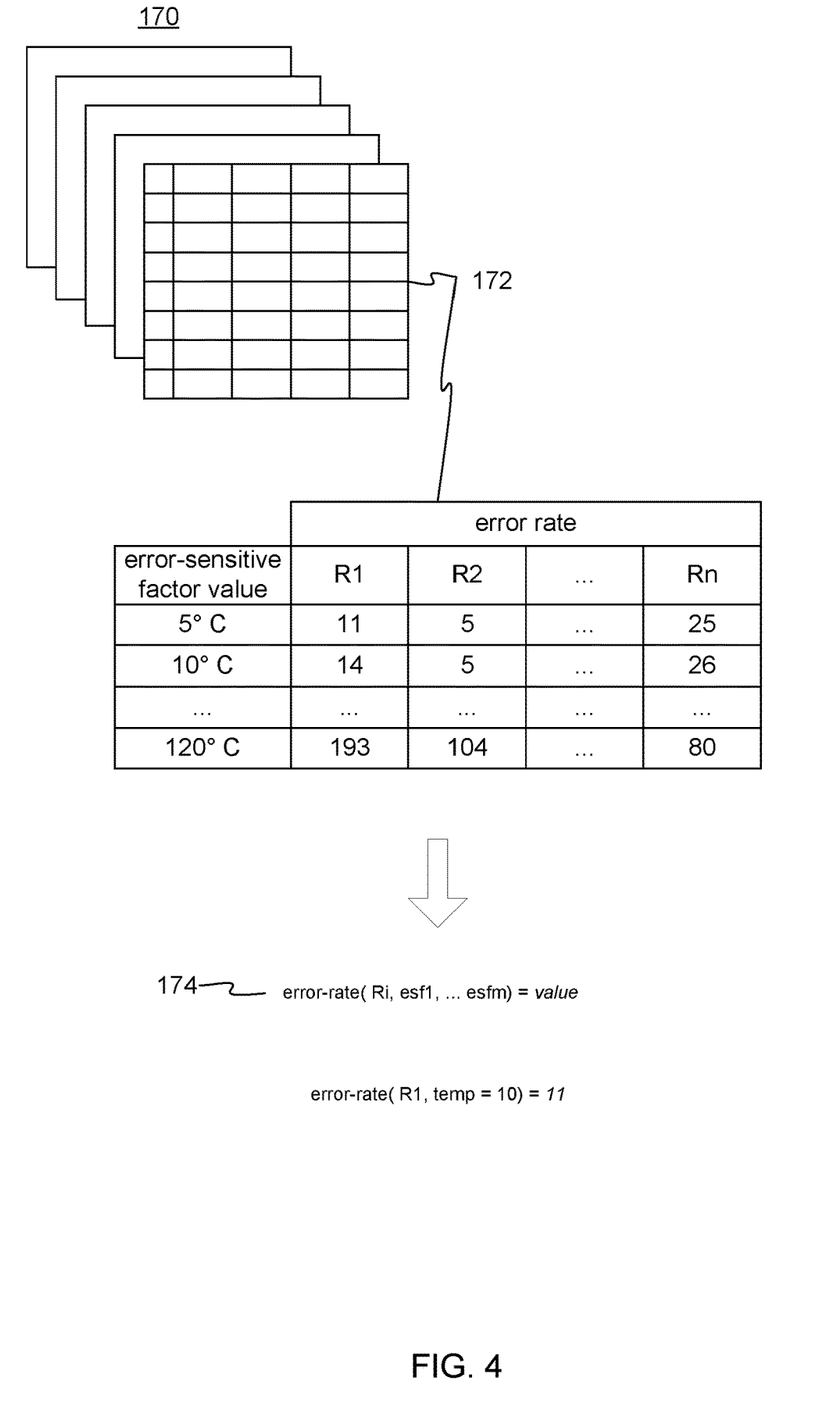
FIG. 4 shows example error measurement statistics for a chip.

FIG. 4 shows example error measurement statistics for a chip. Each table 170 may correspond to a different ESF or ESF combination. For example, table 172 stores statistics for temperature. The table 172 has a column for each region of the chip (a column contains information corresponding to a graph in FIG. 2). An error rate or error statistic of a given region at a given ESF and value thereof can be looked up in the corresponding table 170. In one embodiment, an error function or error profile for a chip is implemented as one or more tables 170 as shown in FIG. 4. In another embodiment, a polynomial or other function may be derived that approximates the error profile of the chip. That is, the function may return an estimated error probability or statistic for a specified region, ESF value(s), etc. Generally, the error function or error behavior information for a chip, regardless of form, will be able to provide an error characteristic or expected error rate for a specified chip region at a specified ESF value. The error function of a chip will also be referred to as an error profile. While error rates will be used as example error traits, any type of error statistic may be used. For example, a chip may be more error sensitive when an ESF is changing or changes rapidly, therefore rate of change in an error statistic, correlation of errors in relation to rate of change in an ESF, or others, may be used.

It should be noted that the regions of a chip can take any form. A region may be determined by physical construction of the chip, by addressing features, etc. A region or area need not be a contiguous unit (either physically or in address space), but as used herein will be considered to include any collection of areas or parts of the chip, e.g., interleaved segments or words, etc. Furthermore, not all parts of a chip need to be measured or included in the chip's error function. For example, regions that have similar error traits may be grouped as a single region. Or, regions that have a similar error rate function may be represented by one of such regions. Note that in some instantiations regions may have different sizes.

An error profile for a chip may have multiple dimensions. For example, temperature may be varied by 5 degree increments, and each increment may be measured for errors over a range of voltages. Thus, an error function may map a region, temperature, and voltage to an error rate. For ease of discussion, examples will have a single ESF. As used herein, an "error rate" includes not only a rate of errors, but also a probability of an error, a measure of reliability, and so forth.

Figure 5:
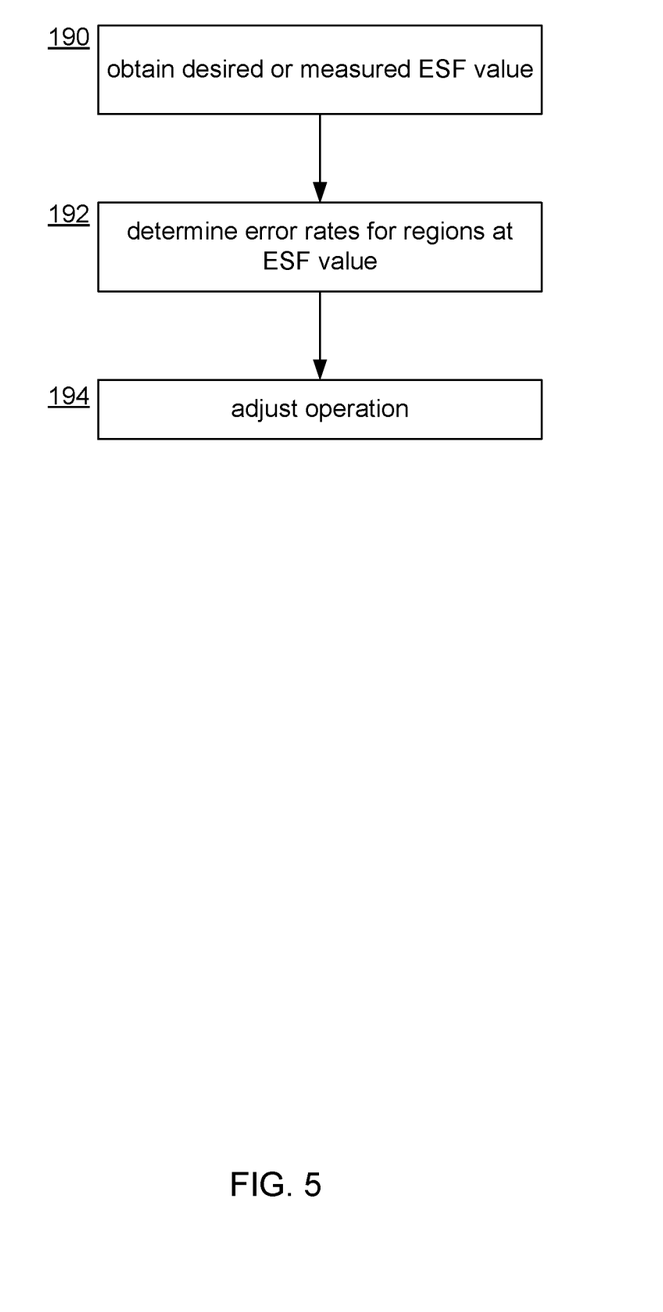
FIG. 5 shows an example of general use of a regional error profile of a chip.

When an error profile for a chip has been obtained, the error profile may be used for many purposes. FIG. 5 shows an example of general use of a regional error profile of a chip. Suppose that a chip such as a DRAM chip is in active use in a computer or other electronic device. Suppose also that an ESF value is obtained 190. This may be a current value for any type of ESF as described. For example, the chip or a controller thereof (a memory controller, a memory board, etc.) may be queried to obtain 190 the current refresh rate for the chip. Given this ESF value, the error profile or error information for the chip is consulted and error rates (or other indicia of statistical error probabilities) at the given value are determined 192 for one or more regions of the chip. The determined 192 error rates or similar information are used to adjust 194 the operation of the chip. In one embodiment, the adjusting may involve excluding some regions from being used, for example. In another embodiment, regions are prioritized so that regions less likely to have an error are used first. Conversely, a setting affecting power usage of the chip may be adjusted. In other embodiments, some regions may be operated using a faster or slower clock rate or using a faster or slower refresh rate.

The adjusting 194 may also involve determining if there is a level of an adjustable ESF that can be set to a new value in view of a desired reliability or power setting. For instance, if an application or operating system running on a computer using the chip specifies a desired level of error probability or error tolerance (e.g., high/medium/low, or some specific number such as a probability of error), then the error profile can be consulted to identify regions of the chip (or corresponding pages of memory) that would operate with acceptable reliability at a different ESF value.

Figure 6:
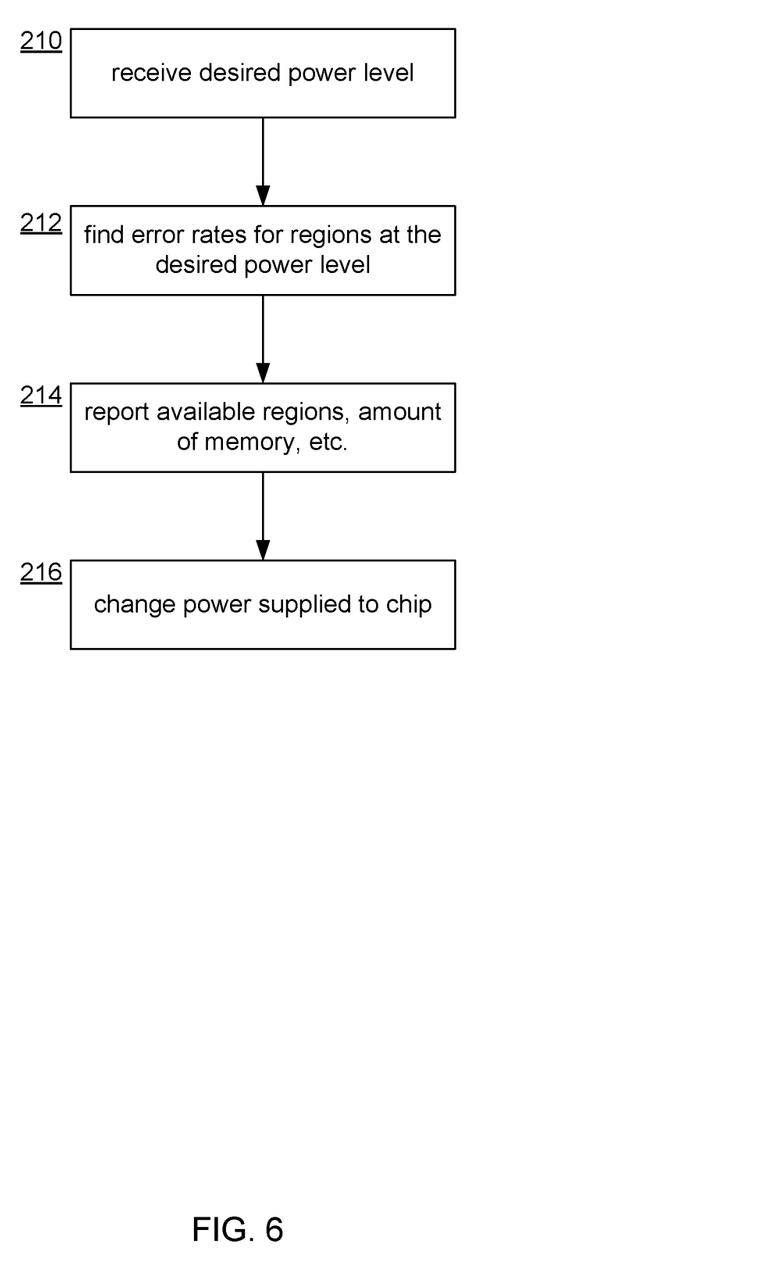
FIG. 6 shows an embodiment to reduce power used by a chip.

FIG. 6 shows an embodiment to reduce power used by a chip. A desired power level is received 210. The power level may be in the form of an actual setting such as "set clock rate to X", or "reduce voltage by Y", or the like. The error profile for the chip is consulted and the error rates for regions are found 212 at the desired power level. In one embodiment, the available regions are reported 214. In response, a control mechanism such as hardware or software may change 216 the actual level of the ESF supplied to the chip (e.g., the voltage is reduced or the refresh rate is changed). In another embodiment, the desired ESF level is adjusted upward or downward if there is insufficient or too much memory available at the initial desired ESF level, and the finding 212 is repeated until a more suitable ESF level is found. In this way, an ESF level setting can be found that will reduce power consumption within some bound such as ratio or size of memory available (i.e., able to perform with sufficient reliability) for use at the desired ESF level.

It will be appreciated that the ability to obtain error information for regions of a chip can be used in almost any way to reduce power consumption by the chip. In yet another embodiment, a chip may have a special portion integrated with error-correction coding (ECC) functionality in the chip. The ECC portion of the chip may be supplemented with regional error information, thus allowing the ECC to operate with greater reliability or efficiency. If the ECC functionality of the chip is detecting more or less errors, the chip may use this information to adjust an ESF to be able to run using more or less power.

In one embodiment, a current ESF value may be used. For instance, a temperature of the chip may indicate, according to the error profile of the chip, that all regions are currently able to operate at an acceptable level of reliability, perhaps as a result of a low temperature value. In response, an operating parameter of the chip, such as memory refresh rate, may be adjusted to lower its power consumption. This example shows that it may be helpful to vary one ESF (e.g., refresh rate) in response to an external setting of another (e.g., temperature) that cannot be controlled.

Figure 7:
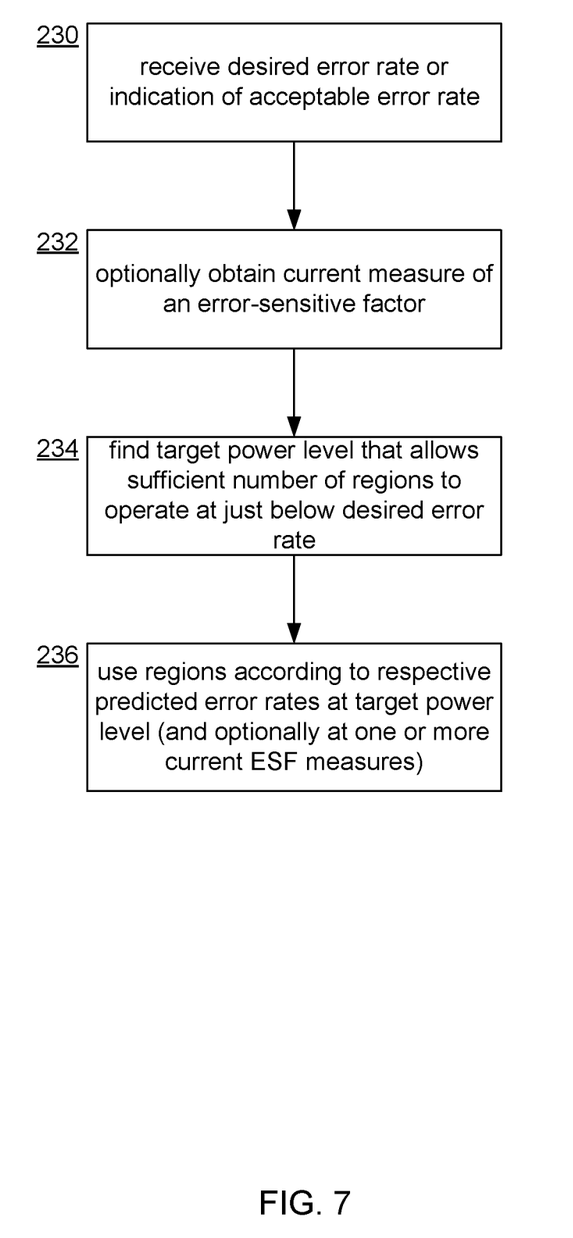
FIG. 7 shows a process for adjusting the error behavior of a chip.

FIG. 7 shows a process for adjusting the error behavior of a chip. Some indication of a change in error behavior is received 230. For example, a signal may indicate that error tolerance should be raised, lowered, set to some specified level, etc. A measure of an ESF may be obtained 232. If the desired acceptable error rate is to be increased, then a power level or other setting of the chip may be found 234 that will, according to the chip's profile, allow the desired error level to be achieved. In the case where the error tolerance is to be raised, an operating level or power supply level is adjusted according to the error profile in a way that allows a sufficient number of regions to operate at the desired error level. Accordingly, regions may be identified that meet the error level and may be used 236 or given priority by a hardware controller, an operation system, a memory manager, or an application.

The error profile of a chip may also be used to allow an application to select memory based on reliability needed by the application. For example, an application may have some data for which reliability is important. The operating system may have a memory manager that obtains information about what portions of physical memory (in the form of one or more memory chips with error profiles) are more or less reliable at a given current level of an ESF (or even without an ESF value). The operating system may then use this region-specific reliability or error rate/probability information to assign memory. When the application requests low reliability memory, the memory may be drawn from regions of one or more chips that are determined to be less reliable (perhaps at a given current ESF measurement or value). When the application requests high reliability memory, regions are selected and assigned accordingly.

In another embodiment, a global approach may be taken. Power consumption may be reduced across an entire computer or subsystems thereof. For example, a clock rate might be lowered. The clock rate is passed to the error rate functions of the computer's memory chips to determine which regions of one or more chips are below a desired level of reliability. Those regions are then flagged by the operating system or memory controller as unavailable. Thus total available memory size is traded for reduction of power.

In another embodiment, a computer or software thereon may make dynamic adjustments to a setting that affects power consumption by analyzing the amount of memory that is being used. When there are substantial portions of memory not in use, the system may look for regions that have an error rate below some threshold at a given value of the setting. Or, the system may pick an incrementally lower or higher value of the setting, use the error profile of a chip to determine error rates for regions at that level, and select the regions that would operate with sufficient reliability. In this way, a system can lower its power consumption while assuring that only memory that has a desired error rate or lower is used. If memory consumption increases, more memory may be made available by increasing the setting (thereby increasing power use) and finding and returning to service regions that, according to their error profile and new setting, will be sufficiently reliable.

Figure 8:
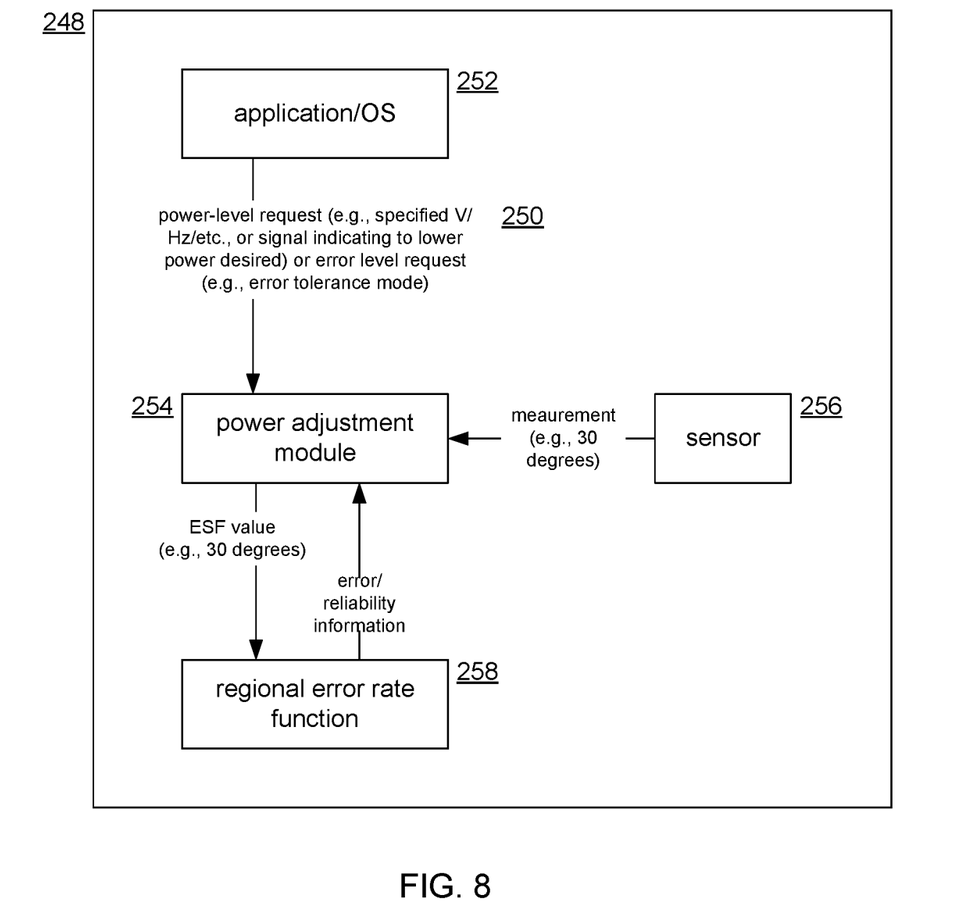
FIG. 8 shows a power-saving embodiment in a computer.

FIG. 8 shows a power-saving embodiment in a computer 248. A signal 250 initiates a power reduction procedure. The signal 250 may originate from within a DRAM chip, from a controller, from a circuit board on which the chip is installed, or from an application or operating system 252, or the like. The signal 250 may trigger a power adjustment module 254. The power adjust module 254 may obtain a measurement from a sensor 256 (or stored setting), for example, temperature, line voltage, current refresh rate, etc. The ESF value from the sensor 256 is passed to an error rate function 258 that returns information about error rates or reliability of regions of a chip according to the ESF value. In one embodiment, the error rate function 258 may perform power analysis to identify and return a power-related setting that would be acceptable. In another embodiment, the error rate function 258 returns information about which regions can tolerate a lower power setting, what are the expected error rates at a next lower power level, etc. The power adjustment module 254 uses this information to adjust a current power setting. For example, the voltage or clock rate may be lowered.

An error profile of a chip may be used for other purposes besides providing reliability granularity and power adjustments. Due to variations in manufacture processes and materials, the error profile for each chip at each setting of any one or more ESF values differs. Thus, the error profile can be used to uniquely identify a chip therefore may be used as a unique hardware or computer identifier which can be used to detect counterfeit chips, detect software piracy, verify identity for online transactions, and others. As described above, an error profile can be computed by measuring error rates at one or more ESFs such as input voltage, refresh rate, and/or temperature (which will be referred to as x). In one embodiment a mean error rate for the entire chip is measured directly or computed from the error rates of a known profile. The mean error rate for the chip at x will be referred to as E(x). The error rate of a region Ri will be: e(x, i), which is the error or reliability function for the chip. A signature bit for a region Ri will be computed as:

$$f(x,i)=\text{sign}(e(x,i)-E(x)).$$

In other words, a bit for a region is 1 if it is above the average and 0 if it is below the average. The overall chip fingerprint is a concatenation or set of the bits of the regions, e.g., f(x, 1), f(x, 2), . . . f(x, K) across K regions of the chip. Of course because each region's error rate may be thought of as a random variable, any variety of signature functions may be derived for the error profile. Moreover, it is possible that the signature can be computed for an assumed or baseline x (representing the value(s) of the ESF(s) of the error profile)), rather than a measured x. Because the error rates for a region and a chip tend to be monotonic, for some chips the error rate for a region will usually be above the average (or below the average) for the range of x. In one embodiment, a region may be selected for inclusion in the signature only if its error rate differs from the mean by more than some threshold. Finally, a comparison between a pre-computed signature and a current computed signature can be performed using a Hamming distance or the like, thus allowing a match to be determined even if some small number of bits differ.

Note that error profiles of a chip may change with time. If the change is significant, an error profile can be recomputed. The error profile may also be designed to model age such that as the chip ages its error profile adapts to the age of the chip.

It should be noted that embodiments described above may be performed by special-purpose on-chip hardware, by software or controller hardware that is not part of the chip, or a combination of both. In a hardware embodiment, a chip may be provided with a special region that is able to compute a profile as discussed above. In another hardware embodiment, a dedicated part of a chip may be designed to run at different parameters and dynamically measure the error rate thereof dynamically. For example, a small region may be able to change its own input voltage or refresh rate and then check for errors in the region. This error rate may then serve as an error profile for the chip.

In another embodiment, an error profile may be based on hierarchies of regions.

CONCLUSION

Figure 9:
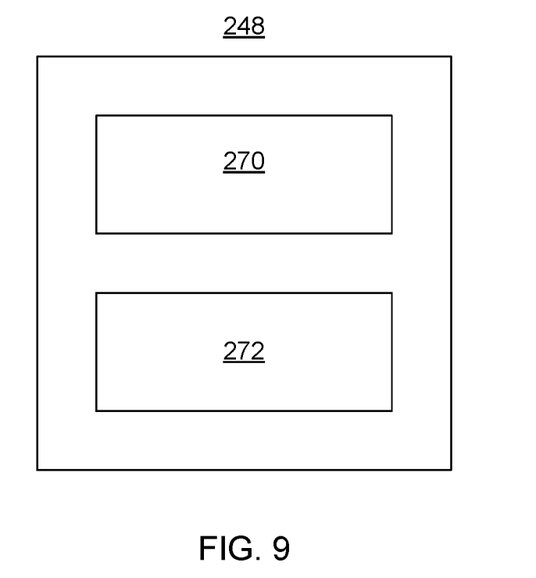
FIG. 9 shows a computer.

FIG. 9 shows computer 248. The computer may have processor(s) 270 and storage 272. Embodiments and features discussed above can be realized by the processor(s) 270 and storage 272. The storage 272 may be in the form of volatile or non-volatile computer or device readable media, which may store information in cooperation with the processor(s) 270 to implement embodiments described herein. The storage 272 may take any form that allows ready access to digital information by the computer 248, for example, optical storage (e.g., CD-ROM), magnetic media, flash ROM, or any current or future means of storing digital information. The stored information can be in the form of machine executable instructions (e.g., compiled executable binary code), source code, bytecode, or any other information that can be used to enable or configure computing devices to perform the various embodiments discussed above. This is also deemed to include at least volatile memory such as RAM and/or virtual memory storing information such as CPU instructions during execution of a program carrying out an embodiment, as well as non-volatile media storing information that allows a program or executable to be loaded and executed. The embodiments and features can be performed on any type of computing device, including portable devices, workstations, servers, mobile wireless devices, and so on.

The invention claimed is:

1. A method performed by a memory device, the method comprising:
    obtaining error counts for two or more regions of the memory device by repeatedly storing original data to the memory device as stored data, reading the stored data as read data, and comparing the read data to the original data;
    determining an error function for each of the two or more regions, wherein the error function provides an estimated error rate for each of the two or more regions based on a value of an error sensitive factor (ESF), the ESF comprising a physical trait of the memory device that can impact a probability that the memory device will incorrectly store data; and
    selecting a memory region of the two or more regions based on the error function.

2. The method according to claim 1, wherein the ESF comprises a voltage of the memory device.

3. The method according to claim 1, wherein each region of the two or more regions has a corresponding error counter that is incremented based on errors occurring in the region.

4. The method according to claim 1, wherein the ESF comprises a temperature of the memory device.

5. The method according to claim 1, wherein the comparing identifies bit-differences between the read data and the original data.

6. The method according to claim 1, wherein an operation state of the selected memory region is altered according to the selection thereof.

7. A chip comprising:
- a region-specific error profile able to indicate a reliability of each region of the chip for a given operating value, wherein the chip comprises multiple regions;
- the region-specific error profile being used to obtain an indication of reliability of each of the multiple regions of the chip at a target operating value; and
- a set of the multiple regions selected based on the indications of reliability of the multiple regions of the chip; and
- the selected set of the multiple regions being made available or unavailable.

8. The chip according to claim 7, wherein the region-specific error profile is generated by a controller controlling the chip.

9. The chip according to claim 7, wherein the given operating value comprises a voltage.

10. The chip according to claim 7, wherein the given operating value comprises a temperature.

11. The chip according to claim 7, wherein a selected region is made unavailable for use when operating the chip.

12. The chip according to claim 7, wherein the given operating value comprises a frequency.

13. The chip according to claim 12, wherein the frequency comprises a frequency of refreshing the chip.

14. The chip according to claim 7, wherein the set of multiple regions is selected based on initiation of a power-saving procedure.

15. A method of operating a memory chip, the method comprising:
- providing an error profile for the memory chip, the error profile comprising information that indicates likelihoods of whether arbitrary regions of the memory chip will erroneously store data for given values of an error-sensitive factor of the memory chip, wherein the error-sensitive factor is any one of the following: age of the memory chip, temperature, voltage, clock frequency, or refresh rate; and
- based on the error profile, prioritizing use of memory regions in the memory chip.

16. The method according to claim 15, further comprising determining whether to make the memory chip available based on the error profile.

17. The method according to claim 15, wherein the likelihoods vary in correspondence with variation of the error-sensitive factor.

18. The method according to claim 15, wherein the error-sensitive factor comprises a refresh rate.

19. The method according to claim 18, wherein the refresh rate is adjusted according to a likelihood indicated by the error profile.

20. The method according to claim 15, wherein the error profile comprises a table providing a likelihood that an arbitrary region of the memory chip will erroneously store data at a given value of the error-sensitive factor.

* * * * *